(12) United States Patent
Weisser et al.

(10) Patent No.: US 8,668,435 B2
(45) Date of Patent: Mar. 11, 2014

(54) VENTILATOR

(75) Inventors: Norbert Weisser, Niedereschach-Kappel (DE); Marcel Paffendorf, Zimmern ob Rottwer (DE); Wolfgang Laufer, Aichhalden (DE); Jürgen Herr, St. Georgen (DE); Stefan Mayer, Brigachtal (DE)

(73) Assignee: EBM-PAPST St. Georgen GmbH & Co. KG, St. Georgen (DE)

( * ) Notice: Subject to any disclaimer, the term of this patent is extended or adjusted under 35 U.S.C. 154(b) by 357 days.

(21) Appl. No.: 13/054,076

(22) PCT Filed: Dec. 7, 2009

(86) PCT No.: PCT/EP2009/008710
§ 371 (c)(1),
(2), (4) Date: Jan. 13, 2011

(87) PCT Pub. No.: WO2010/075931
PCT Pub. Date: Jul. 8, 2010

(65) Prior Publication Data
US 2011/0116909 A1    May 19, 2011

(30) Foreign Application Priority Data
Dec. 8, 2008 (DE) ............ 20 2008 016 733 U

(51) Int. Cl.
*F04D 25/14* (2006.01)
(52) U.S. Cl.
USPC ............................ 415/26; 415/146; 415/211.2

(58) Field of Classification Search
USPC ............ 415/26, 36, 39, 41, 47, 49, 126, 146, 415/147, 151, 160, 182.1, 183, 185, 208.1, 415/209.2, 128
See application file for complete search history.

(56) References Cited

U.S. PATENT DOCUMENTS

| 3,334,569 A | * | 8/1967 | Lambie | 454/352 |
| 3,888,166 A |   | 6/1975 | Stottmann | 98/85 |

(Continued)

FOREIGN PATENT DOCUMENTS

| DE | 10 2007 037320 A | 3/2008 | |
| EP | 1 898 685 A | 3/2008 | |
| WO | WO 2007142218 A1 * | 12/2007 | E05F 3/20 |

OTHER PUBLICATIONS

Machine Translation of WO 2007142218 A1 Description from http://patentcsope.wipo.int/search/en/detail.jsf on Mar. 26, 2013.*

*Primary Examiner* — Nathaniel Wiehe
*Assistant Examiner* — Wayne A Lambert
(74) *Attorney, Agent, or Firm* — Milton Oliver, Esq.; Oliver Intellectual Property LLC

(57) ABSTRACT

A fan (100) has a fan housing (110). The latter has an air entrance opening (120) and an air exit opening (130). It further has a swivel joint arrangement (180) having at least one swivel joint (145, 147, 155, 157, 165, 167, 175, 177) that is arranged on a joint carrier (188; 188'); at least one non-return flap (140, 150, 160, 170) that is journaled rotatably by means of the at least one swivel joint (145, 147, 155, 157, 165, 167, 175, 177) and, in its closed position, at least partly closes off the air exit opening (130); and at least one elastic return member (142, 152, 162, 172) that is associated with the at least one non-return flap (140, 150, 160, 170) and urges it toward its closed position.

23 Claims, 9 Drawing Sheets

(56) References Cited

U.S. PATENT DOCUMENTS

Figure 1:
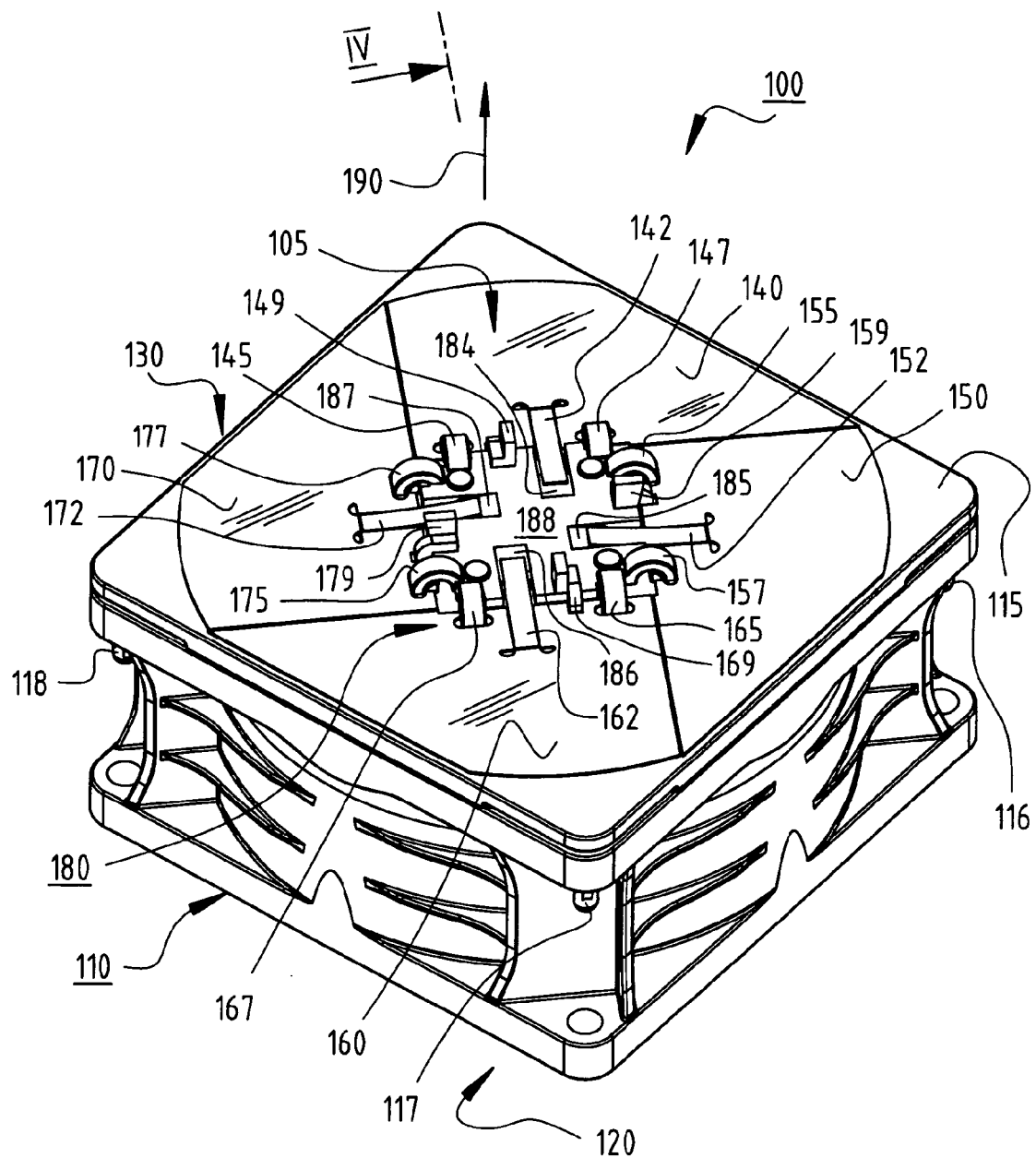

| | | | |
|---|---|---|---|
| 6,011,689 A * | 1/2000 | Wrycraft | 361/695 |
| 6,115,250 A * | 9/2000 | Schmitt | 361/695 |
| 6,174,232 B1 * | 1/2001 | Stoll et al. | 454/184 |
| 7,302,967 B2 * | 12/2007 | Maeda et al. | 137/512.1 |
| 7,416,481 B2 * | 8/2008 | Baker et al. | 454/184 |
| 7,431,640 B1 * | 10/2008 | Meserth et al. | 454/184 |
| 7,611,403 B2 * | 11/2009 | Wenger | 454/338 |
| 2008/0056900 A1 * | 3/2008 | Seidler | 416/193 R |
| 2009/0090494 A1 * | 4/2009 | Seidler et al. | 165/158 |
| 2011/0228477 A1 * | 9/2011 | Hong | 361/695 |

\* cited by examiner

VENTILATOR

CROSS-REFERENCE

This application is a section 371 of PCT/EP09/08710, filed 7 Dec. 2009, and published as WO 2010-075931-A1, claiming priority from German Application DE 20 2008 016 733.7, filed 8 Dec. 2008.

FIELD OF THE INVENTION

The present invention relates to a fan, such as an axial or diagonal fan.

BACKGROUND

In order to cool electronic devices, multiple fans are often operated in parallel in a fan tray, for example in a so-called rack for servers or in the electrical cabinet of a mobile radio station. The use of multiple fans results in redundancy, i.e. if one of the fans fails, the remaining fan or fans ensure that sufficient cooling air continues to be available.

When one of the fans in a fan tray fails, and the other fans continue to run, air would circulate in short-circuited fashion through the stationary fan. This short-circuit flow must therefore be minimized. Fans having non-return flaps that close automatically when air is flowing in the wrong direction are used for this purpose. U.S. Pat. No. 6,174,232 B1, STOLL et al., shows one example of this; it also describes the problem that the non-return flaps that are used represent an additional flow resistance, and consequently reduce fan performance.

SUMMARY OF THE INVENTION

It is consequently an object of the invention to make available a novel fan.

This object is achieved by a fan having one or more flaps, each rotatable on a swivel joint between an open orientation and a closed orientation, together with a respective associated elastic return member to urge each flap toward the closed orientation. With this, a return member having a comparatively low return force can be used, thanks to the use of an articulated linkage and, separately therefrom, a spring arrangement of the non-return flap; during operation of the fan, this force generates a low opening resistance to a corresponding air flow direction but is nevertheless sufficient to close off the housing of the fan in any installation position and/or when an air flow occurs in an opposite flow direction.

Preferred refinements are described below. A particularly advantageous embodiment is to have the elastic return member abut against an elevated lug when the flap is a closed orientation. It enables a high closing force in the closed state, combined with a moderately high closing force in the open state.

BRIEF FIGURE DESCRIPTION

Figure 2:
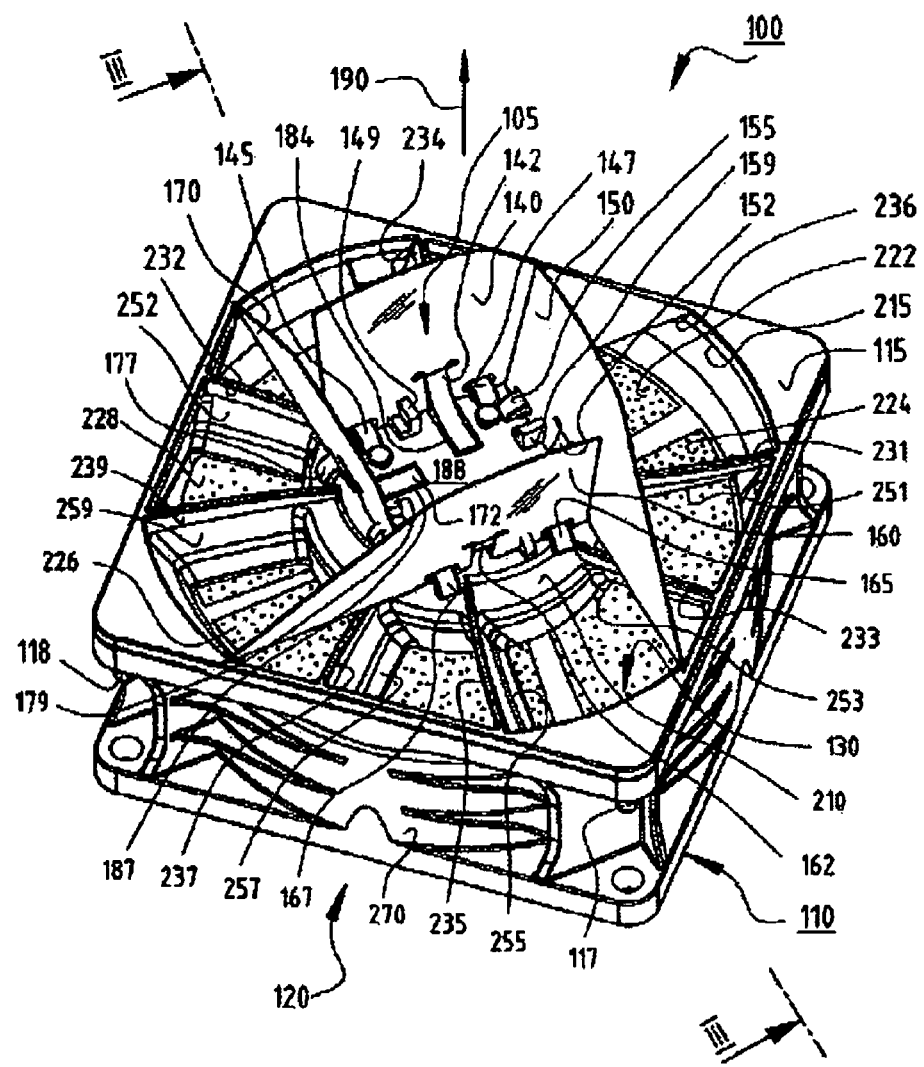
Figure 3:
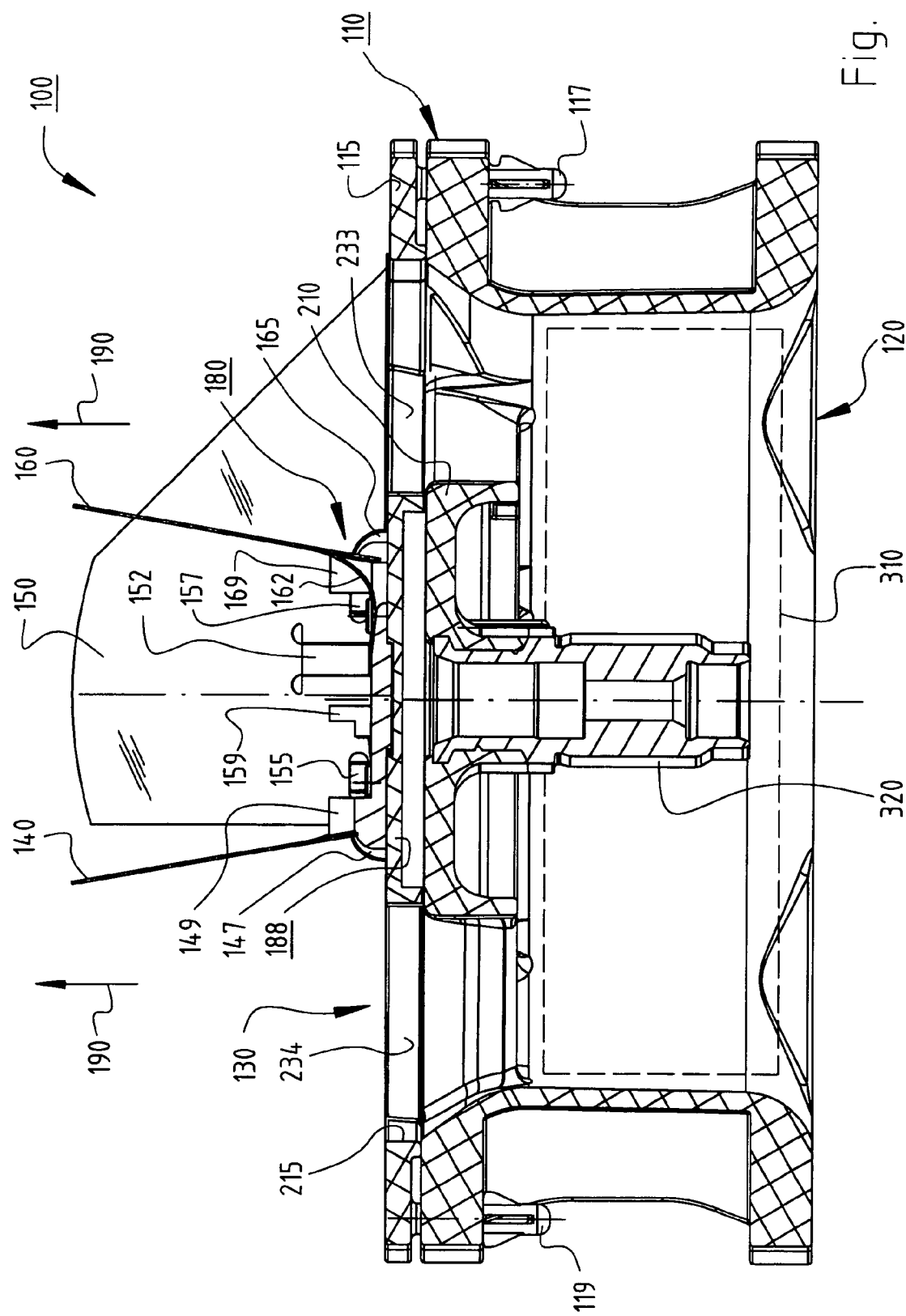
Figure 4:
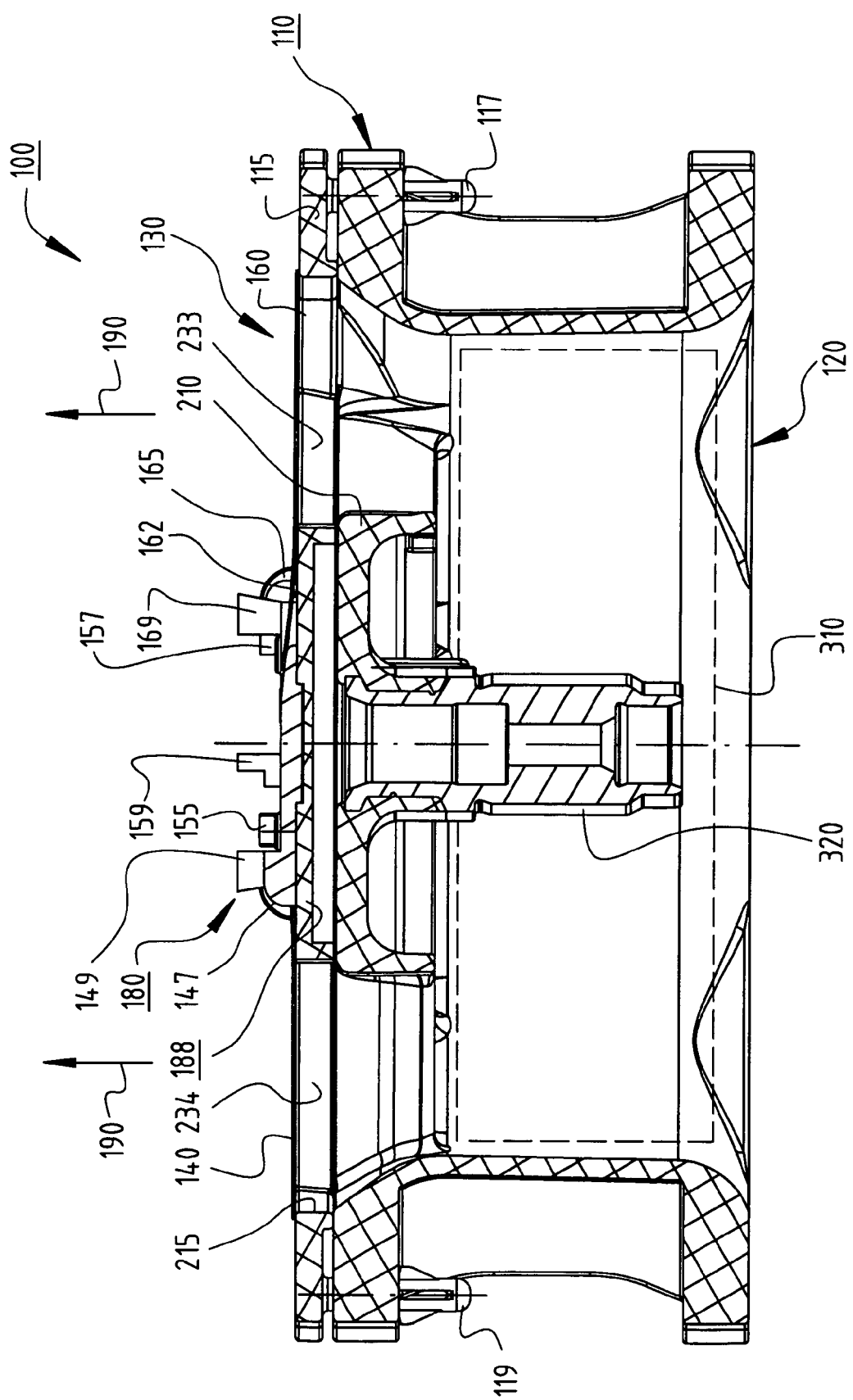
Figure 5:
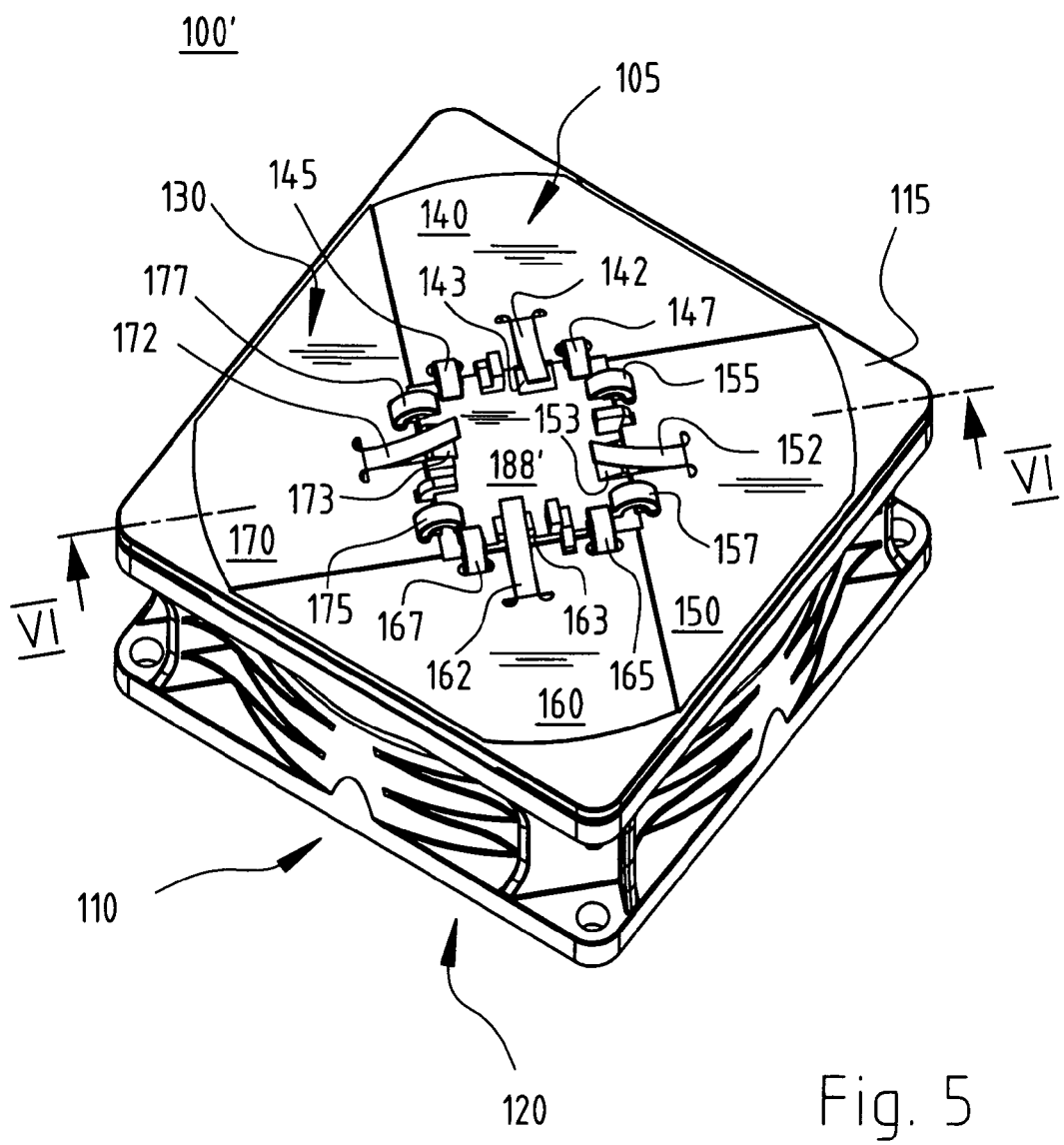
Figure 6:
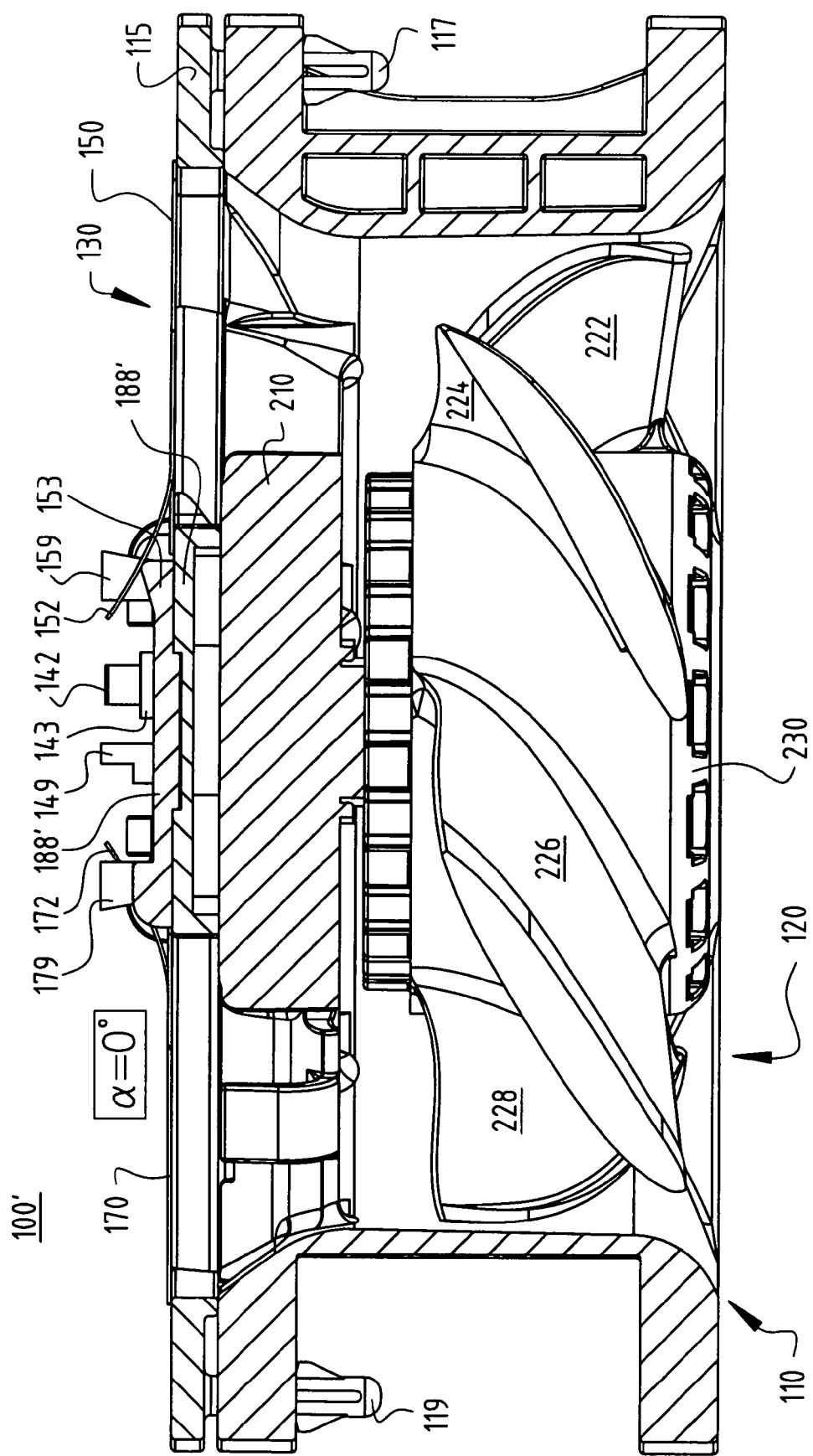
Figure 7:
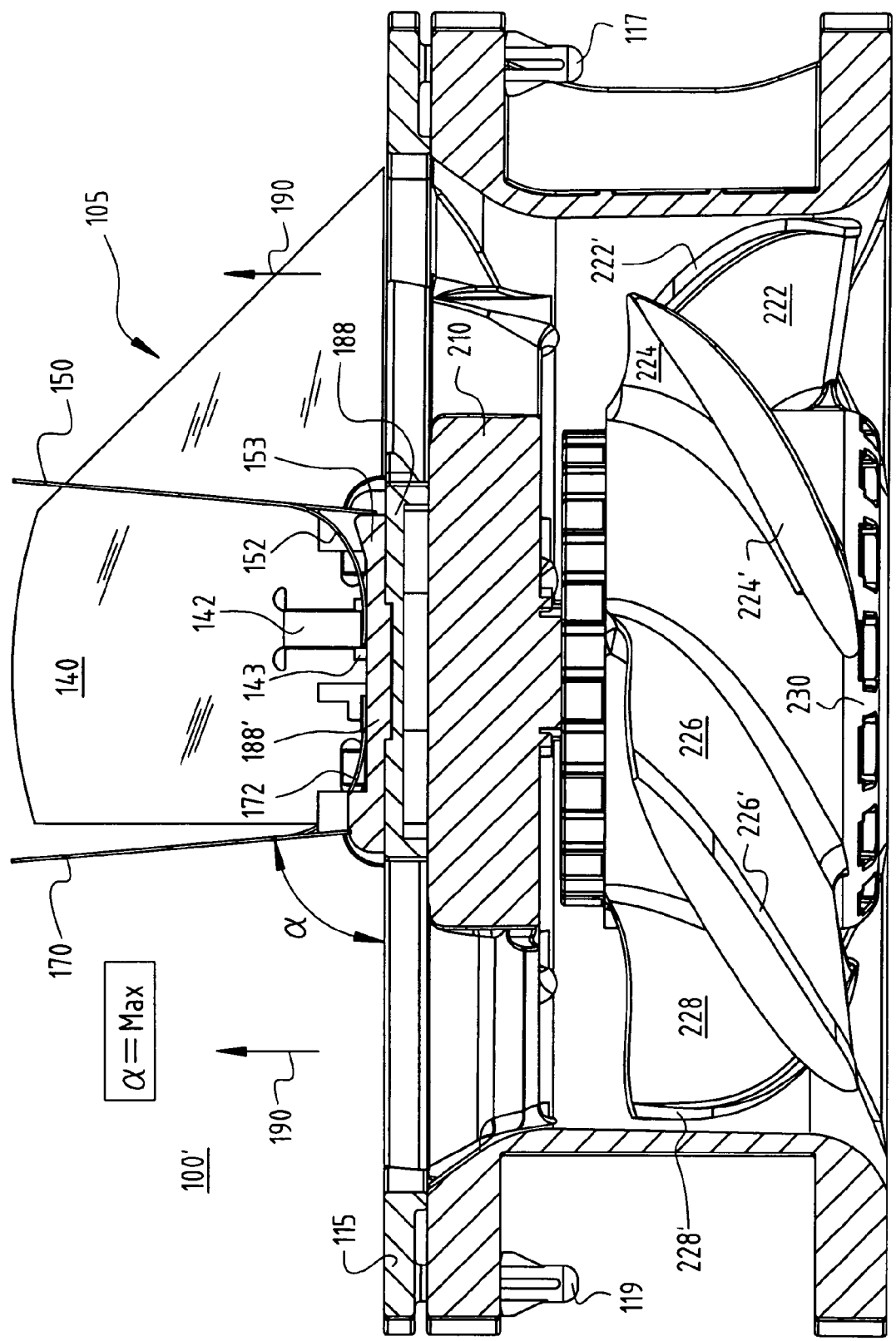
Figure 8:
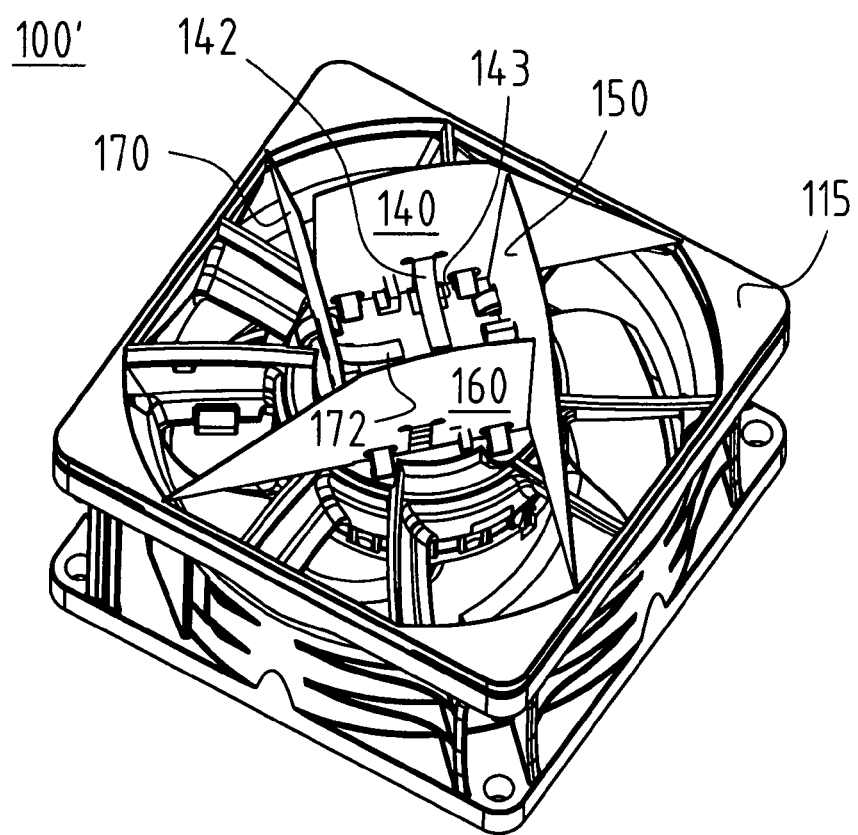
Figure 9:
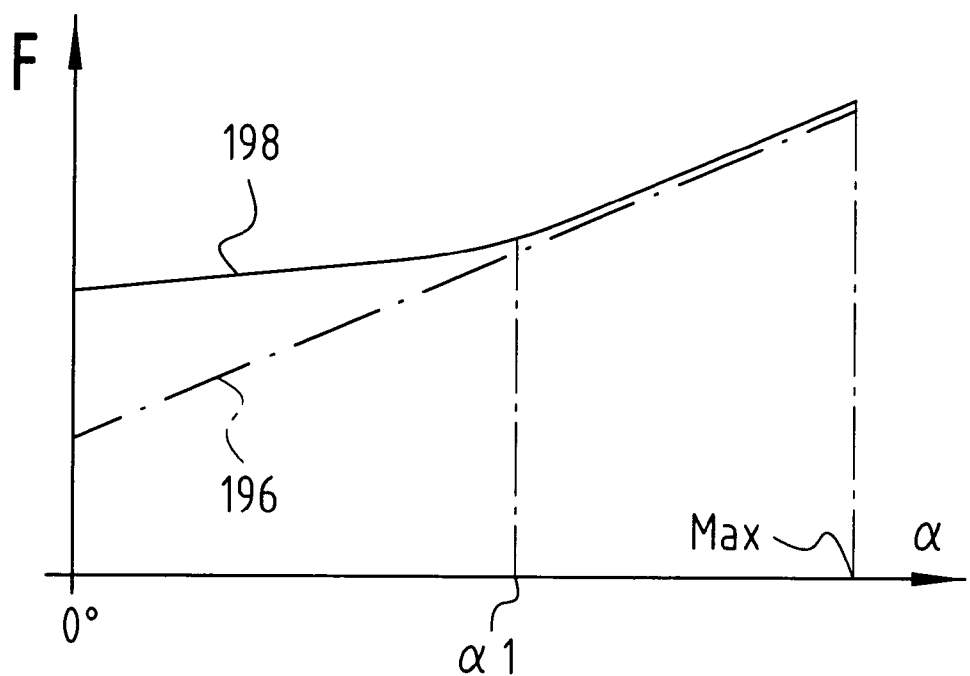

Further details and advantageous refinements of the invention are evident from the exemplifying embodiments, in no way to be understood as a limitation of the invention, that are described below and depicted in the drawings, in which:

FIG. 1 is a perspective view of a fan 100 with closed non-return flaps 140, 150, 160, 170, in accordance with a first exemplifying embodiment, FIG. 2 is a perspective view of fan 100 of FIG. 1 with open non-return flaps 140, 150, 160, 170, FIG. 3 is a sectioned view of fan 100 of FIG. 1 looking along lines III-III of FIG. 2, with the non-return flaps open, FIG. 4 is a sectioned view of fan 100 looking along line IV-IV of FIG. 1, and with the non-return flaps closed, FIG. 5 is a three-dimensional depiction of a second exemplifying embodiment, in a depiction analogous to FIG. 1, FIG. 6 is a section, viewed along line VI-VI of FIG. 5, that shows the flaps in their closed position, FIG. 7 is a depiction analogous to FIG. 6 but with the closure flaps open, FIG. 8 is a three-dimensional depiction of the fan in its position according to FIG. 7, and FIG. 9 is a graph showing at 196 the closing force F in the context of the first exemplifying embodiment (FIGS. 1 to 4), and at 198 the closing force F in the context of the second exemplifying embodiment (FIGS. 5 to 8).

DETAILED DESCRIPTION

In the description that follows, the terms "left," "right," "front," "back," "upper," and "lower" refer to the particular Figure of the drawings, and can vary from one Figure to the next as a function of a particular orientation (portrait or landscape) that is selected. Identical or identically functioning parts are labeled with the same reference characters in the various Figures, and usually are described only once.

FIG. 1 shows a first exemplifying embodiment of a fan 100 having a fan housing 110 that has an air entrance opening 120 and an air exit opening 130. Fan 100 is preferably an axial or diagonal fan that generates, in operation, an air flow in the direction of an arrow 190.

Fan housing 110 is equipped with a non-return flap arrangement 105 that comprises a swivel joint arrangement 180 arranged on a joint carrier 188, and a predetermined number of non-return flaps 140, 150, 160, 170. Joint carrier 188 is mounted, by way of example, on a separate carrier element 115 that is connected to fan housing 110 via mounting elements 116, 117, 118, 119 (FIG. 4). This carrier element 115 can also be implemented as a guide vane.

Swivel joint arrangement 180 has a predetermined number of swivel joints 145, 147, 155, 157, 165, 167, 175, 177, which are arranged on joint carrier 188 and by means of which non-return flaps 140, 150, 160, 170 are rotatably journaled. A first non-return flap 140 is rotatably journaled on swivel joints 145, 147, a second flap 150 on swivel joints 155, 157, a third flap 160 on swivel joints 165, 167, and a fourth flap 170 on swivel joints 175, 177. Swivel joints 145, 147, 155, 157, 165, 167, 175, 177 are preferably implemented as hinges.

According to an embodiment, each non-return flap 140, 150, 160, 170 has associated with it at least one elastic return member 142, 152, 162, 172 that urges said flap 140, 150, 160, 170 toward its closed position. Return member 142 is associated with non-return flap 140, return member 152 with flap 150, return member 162 with flap 160, and return member 172 with flap 170. These return members 142, 152, 162, 172 are preferably mounted on the respective associated non-return flap 140, 150, 160, 170, and abut slidingly, under preload, against joint carrier 188. Sliding surfaces 184, 185, 186, 187 for the respective return members 142, 152, 162, 172 are provided for this purpose on joint carrier 188 (see FIG. 1).

Be it noted, however, that the mounting of return members 142, 152, 162, 172 on the respective associated non-return flaps 140, 150, 160, 170 is described merely by way of example and not as a limitation of the invention. Other configurations are likewise possible in the context of the invention. For example, return members 142, 152, 162, 172 can be mounted on joint carrier 188 and can abut slidingly under preload against the respective associated non-return flaps 140, 150, 160, 170 in order to urge them in the closing direction.

Return members 142, 152, 162, 172 are preferably implemented as spring elements, in particular as spring tongues, which at one end are mounted on the respective non-return flaps 140, 150, 160, 170 and at the other end are supported slidingly in the respective sliding surfaces 184, 185, 186, 187. Non-return flaps 140, 150, 160, 170 and the respective associated spring tongues 142, 152, 162, 172 are preferably implemented integrally, for example from a plastic film. The latter can have a thickness that, in accordance with an embodiment, is in the range from 0.02 mm to 5 mm. As an alternative to this, non-return flaps 140, 150, 160, 170 and the respective associated spring tongues 142, 152, 162, 172 can be implemented as an integral injection-molded part or as an integral two-component plastic part.

Sliding surfaces 184, 185, 186, 187 are preferably arranged in regions of joint carrier 188 that are separated from regions that are associated with swivel joints 145, 147, 155, 157, 165, 167, 175, 177 that are implemented as hinges. Hinges 145, 147, 155, 157, 165, 167, 175, 177, and the spring linkages implemented by spring tongues 142, 152, 162, 172, thus constitute separate axes, so that the spring length can be longer than the hinge length. This enables an advantageous embodiment of non-return flap arrangement 105 with spring tongues 142, 152, 162, 172 that have a comparatively low spring force. Regardless of the rotation axis of the flaps, the spring force can be varied by way of the distance from the rotation axis and the length, width, thickness, and shape of the spring. A correct selection of spring length and spring shape allows overextension of the spring to be prevented or greatly reduced.

According to an embodiment, non-return flaps 140, 150, 160, 170 are implemented, when in their closed position (e.g. when fan 100 is out of service or switched off), to close off air exit opening 130 at least in part, and are therefore urged by the respective associated spring tongues 142, 152, 162, 172 in the closing direction. During operation of fan 100 (as shown in FIG. 2), non-return flaps 140, 150, 160, 170 are rotated about swivel joints 145, 147, 155, 157, 165, 167, 175, 177 in the direction of arrow 190, and then, in the open state, extend away from fan 100. In order to limit the opening angle of the respective flaps 140, 150, 160, 170 in their open state, each of them has a respective stop 149, 159, 169, 179 associated with it. For example, a stop 149 is associated with non-return flap 140, a stop 159 with flap 150, a stop 169 with flap 160, and a stop 179 with flap 170. The stop can also be reduced by abutment against another flap.

FIG. 2 shows fan 100 of FIG. 1 in operation. Here non-return flaps 140, 150, 160, 170 are opened by an air flow in the direction of arrow 190 generated by fan blades 222, 224, 226, 228, as described below using the example of non-return flap 140.

According to an embodiment, the air flow in the direction of arrow 190 generated by fan blades 222, 224, 226, 228 presses against non-return flap 140 so that it is rotated about swivel joints 145, 147 in the direction of arrow 190 against the spring force of spring tongue 142; spring tongue 142 slides on sliding surface 184 (FIG. 1), and presents little opening resistance to the air flow. Flap 140 is thereby opened until it comes to a stop against stop 149 (see FIG. 3), which thus on the one hand limits the opening angle of flap 140 in the open state and on the other hand ensures that flap 140 can close again only in the opposite direction. In addition, the flap is constantly impinged upon by air and therefore cannot flutter. This reduces wear.

FIG. 2 illustrates an embodiment in which joint carrier 188 is mounted on carrier element 115, which is connected via mounting elements 116 (FIG. 1), 117, 118, 119 (FIG. 4) to fan housing 110. Carrier element 115 is implemented in the shape of a frame and has an air passthrough opening 215 in which joint carrier 188 is held via struts 231, 232, 233, 234, 235, 236, 237, 239. The struts also form the stops for the closed flaps.

According to an embodiment, carrier element 115 is implemented in such a way that joint carrier 188 is arranged in the region of a fan flange 210 that is provided in the region of air exit opening 130, and is connected there via associated struts 251, 252, 253, 255, 257, 259 to an outer wall 270 of fan housing 110 (see FIG. 3).

Be it noted that the arrangement of joint carrier 188 in carrier element 115 is described merely by way of example and not as a limitation of the invention. Further configurations are possible, for example in which joint carrier 188 is mounted directly on fan flange 210. This can be accomplished, for example, by laser welding, adhesive bonding, ultrasound, cold casting, bolting, and/or snap-locking to fan flange 210. As an alternative to this, joint carrier 188 can also be an integrated constituent of fan flange 210. In these embodiments, carrier element 115 and struts 251, 252, 253, 255, 257, 259 can be omitted. The joint carrier can likewise be integrated onto carrier element 115.

FIG. 3 is a sectioned view of fan 100 of FIG. 1, indicating components 310 of fan 100 that are arranged in the region of a bearing tube 320 of fan housing 110. These components encompass, for example, fan blades 222, 224, 226, 228 of FIG. 2 as well as further electronic and mechanical constituents of fan 100, e.g. an electric motor having a stator arrangement and a rotor cup on which fan blades 222, 224, 226, 228 can be mounted.

FIG. 3 illustrates the mounting of carrier element 115 on fan housing 110 by means of mounting elements 116 (FIG. 1), 117, 118 (FIG. 2), 119, and the arrangement of joint carrier 188 in the region of fan flange 210. Mounting elements 116 (FIG. 1), 117, 118 (FIG. 2), 119 snap-lock carrier element 115 onto fan housing 110. It is, however, likewise possible to bolt, adhesively bond, and/or weld carrier element 115 onto fan housing 110.

FIG. 3 also illustrates non-return flaps 140, 150, 160 that abut during the operation of fan 100 against respective stops 149, 159, 169 and are consequently opened to a maximum opening angle.

FIG. 4 is a sectioned view of fan 100 of FIG. 1 with non-return flaps 140, 160 closed, illustrating the action of spring tongue 162 on flap 160 that urges flap 160 toward its closed position.

FIGS. 5 to 8 show a second exemplifying embodiment in which the closing force F of the non-return flaps is higher when said flaps are closed or are in the vicinity of their closed position. Unpleasant rattling can thereby be reduced or in fact entirely eliminated.

Because FIGS. 5 to 8 differ only slightly from FIGS. 1 to 4, the same reference characters are used for the most part. Reference is therefore made, in the interest of brevity, to the description of FIGS. 1 to 4. Like FIGS. 1 to 4, FIGS. 5 to 8 show a fan 100' having a fan housing 110 that has an air entrance opening 120 and air exit opening 130.

An arrangement 105 having four non-return flaps 140, 150, 160, 170 is mounted on fan housing 110. This arrangement has a joint carrier 188', and the non-return flaps are articulated on said carrier by means of swivel joints 145, 147, 155, 157, 165, 167, 175, 177.

Here as well, each non-return flap has an elastic return member 142, 152, 162, 172 associated with it.

In contrast to FIGS. 1 to 4, in the case of FIGS. 5 and 6 the return members abut against a lug when the flaps are closed. FIG. 6 shows one such lug 143 for return member 142, and a lug 153 for return member 152. FIG. 5 shows all four lugs 143, 153, 163, 173, which preferably are implemented identically. FIGS. 5 and 6 show the cross-sectional shape using the example of lug 153. The latter is maximally effective when the relevant flap 150 is closed. When flap 150 is open (FIGS. 7 and 8), lug 153 acts only as a stop that limits the opening angle α of flap 150 to a maximum value "Max.".

As FIGS. 5 and 6 show, lugs 143, 153, 163, 173 are provided here on a separate shaped part 188' that is mounted on joint carrier 188, e.g. by adhesive bonding or welding. This allows economical manufacture of shaped part 188' and flap arrangement 105.

FIGS. 6 to 8 show fan blades 222, 224, 226, 228 that are arranged on external rotor 230 of an electronically commutated external-rotor motor. The blades have, on their periphery, extensions 222', 224', 226', 228' (FIG. 7) having a profile corresponding approximately to that of an airplane wing, thereby achieving a reduction in fan noise.

FIGS. 7 and 8 show fan 100' in operation, flaps 140 to 170 being opened by air flow 190 (FIG. 7). Return members 142, 152, 162, 172 are no longer abutting against lugs 143, to 173 (see FIG. 7), and these lugs then serve as stops for flaps 140 etc. (see FIG. 7). Further stops can also additionally be provided.

FIG. 9 shows a curve 196 that indicates, for FIGS. 1 to 4, as a function of the opening angle α of flap 140 etc., the closing force F, i.e. the force with which a flap 140 etc. is pressed against its valve seat.

FIG. 9 further shows a curve 198 that indicates, for FIGS. 5 to 8, the same force F as a function of angle α. It is evident that in an angle range from 0° to α1, i.e. up to approximately half the maximum opening angle, closing force F in curve 198 is selectively elevated; this reduces or entirely eliminates irritating rattling of flaps 140 etc. in FIGS. 5 to 8.

Numerous variants and modifications are of course possible within the scope of the present invention.

The invention claimed is:

1. A fan (100), selected from the group consisting of an axial fan and a diagonal fan, having a fan housing (110) that comprises:
   an air entrance opening (120);
   an air exit opening (130);
   a swivel joint arrangement (180) having at least one swivel joint (145, 147, 155, 157, 165, 167, 175, 177) that is arranged on a joint carrier (188; 188');
   at least one non-return flap (140, 150, 160, 170) that is journaled rotatably by means of the at least one swivel joint (145, 147, 155, 157, 165, 167, 175, 177) and, in a closed orientation, at least partly closes off the air exit opening (130);
   at least one elastic return member (142, 152, 162, 172), that is arranged between the non-return flap (140, 150, 160, 170) and joint carrier (188; 188'), and is mounted on the non-return flap and abuts slidingly with a preload against the joint carrier (188; 188'), and thereby urges said non-return flap (140, 150, 160, 170) in a closing direction.

2. The fan according to claim 1, in which the non-return flap, and the elastic return member associated with it, are implemented integrally.

3. The fan according to claim 1, in which the non-return flap (140, 150, 160, 170) and the elastic return member (142, 152, 162, 172) are implemented from a plastic film whose thickness falls in the range from 0.01 to 5 mm.

4. The fan according to claim 1, in which the non-return flap, and the elastic return member associated with it, are implemented as an integral injection-molded part.

5. The fan according to claim 1, in which the elastic return member is implemented as an elongated spring tongue.

6. The fan according to claim 1, in which the joint carrier (188; 188') is provided on a carrier element (115) that is connectable to the fan housing (110) and that, together with the joint carrier (188), defines air passthrough openings that are closable by the non-return flaps (140, 150, 160, 170).

7. The fan according to claim 6, wherein mounting elements (116, 117, 118, 119) are provided on the carrier element (115) for mounting it on the fan housing (110).

8. The fan according to claim 1, in which the joint carrier (188; 188') comprises at least one stop (149, 159, 169, 179) that, when the at least one non-return flap is open, limits the opening angle α thereof.

9. A fan (100), selected from the group consisting of an axial fan and a diagonal fan, having a fan housing (110) that comprises:
   an air entrance opening (120);
   an air exit opening (130);
   a swivel joint arrangement (180) having at least one swivel joint (145, 147, 155, 157, 165, 167, 175, 177) that is arranged on a joint carrier (188; 188');
   at least one non-return flap (140, 150, 160,170,) that is journaled rotatably by means of the at least one swivel joint (145, 147, 155, 157, 165, 167, 175, 177) and in a closed orientation at least partly closes off the air exit opening (130);
   at least one elastic return member (142, 152, 162, 172) that is arranged between the non-return flap (140, 150, 160, 170) and joint carrier (188; 188'), and is mounted on the non-return flap and abuts slidingly with a preload against the joint carrier (188; 188') and thereby urges said non-return flap (140, 150, 160, 170) in a closing direction, wherein
   the elastic return member (142 152, 162, 172) that is mounted on the non-return flap (140, 150, 160, 170) has, associated with it, a sliding surface (184, 185, 186, 187) which is provided on the joint carrier (188; 188') and against which the elastic return member abuts, and wherein the sliding surface is equipped, on its side facing toward the swivel joint for the non-return flap associated with it, with a lug elevation (143, 153, 163, 173) against which the elastic return member abuts when the non-return flap is closed, and which in that position increases the return force (F) of the elastic return member (142, 152, 162, 172).

10. The fan according to claim 9, in which the lug elevation (143, 153, 163, 173) is so configured that in the vicinity of the open position of the associated non-return flap (140, 150, 160, 170), said lug elevation does not substantially influence the return force (F) acting on said associated non-return flap.

11. The fan according to claim 9, in which the lug elevation (143, 153, 163, 173) is implemented as a stop, against which the associated non-return flap abuts in its open position.

12. A fan (100), selected from the group consisting of
   an axial fan and a diagonal fan, having
   a fan housing (110) that comprises:
      an air entrance opening (120);
      an air exit opening (130);
      a swivel joint arrangement (180) having at least one swivel joint (145, 147, 155, 157, 165, 167, 175, 177) that is arranged on a joint carrier (188; 188');

at least one non-return flap (140, 150, 160, 170) that is journaled rotatably by means of the at least one swivel joint (145, 147, 155, 157, 165, 167, 175, 177) and, in its closed position, at least partly closes off the air exit opening (130);

at least one elastic return member (142, 152, 162, 172), that is arranged between the non-return flap (140, 150, 160, 170) and joint carrier (188; 188'), and is mounted on the joint carrier and abuts slidingly with a preload against the non-return flap, and thereby urges said non-return flap (140, 150, 160, 170) in a closing direction.

13. The fan according to claim 12, in which the non-return flap and the elastic return member are implemented integrally.

14. The fan according to claim 13, in which the joint carrier (188; 188') is provided on a carrier element (115) that is connectable to the fan housing (110) and that, together with the joint carrier (188), defines air passthrough openings that are closable by the non-return flaps (140, 150, 160, 170).

15. The fan according to claim 14, in which mounting elements (116, 117, 118, 119) are provided on the carrier element (115) for mounting it on the fan housing (110).

16. The fan according to claim 12, in which the non-return flap (140, 150, 160, 170) and the elastic return member (142, 152, 162, 172) are implemented from a plastic film whose thickness falls in the range from 0.01 to 5 mm.

17. The fan according to claim 12, in which the non-return flap and the elastic return member associated with it are implemented as an integral injection-molded part.

18. The fan according to claim 12, in which the elastic return member is implemented as an elongated spring tongue.

19. The fan according to claim 12, in which the joint carrier (188; 188') comprises at least one stop (149, 159, 169, 179) that, when the at least one non-return flap is open, limits the opening angle α thereof.

20. The fan according to claim 12, in which the elastic return member that is mounted on the joint carrier has, associated with it, a sliding surface (184, 185, 186, 187) which is provided on the non-return flap and against which the elastic return member abuts.

21. The fan according to claim 20, in which the sliding surface is equipped, on its side facing toward the swivel joint for the non-return flap associated with a lug elevation (143, 153, 163, 173) against which the elastic return member abuts when the non-return flap is closed, and which in that position increases the return force (F) of the elastic return member.

22. The fan according to claim 21, in which the lug elevation (143,153, 163, 173) is implemented so that in the vicinity of the open position of the associated non-return flap (140, 150, 160, 170), said lug elevation does not substantially influence the return force (F) acting on said associated non-return flap.

23. The fan according to claim 21, in which the lug elevation (143, 153, 163, 173) is implemented as a stop, against which the associated non-return flap abuts in its open position.

* * * * *